United States Patent [19]

Machida et al.

[11] Patent Number: 4,901,153

[45] Date of Patent: Feb. 13, 1990

[54] IMAGE SENSOR WITH REDUCED SURFACE REFLECTION INTERFERENCE

[75] Inventors: Satoshi Machida; Yukito Kawahara; Hiroshi Mukainakano, all of Tokyo, Japan

[73] Assignee: Seiko Instruments Inc., Tokyo, Japan

[21] Appl. No.: 227,179

[22] Filed: Aug. 2, 1988

[51] Int. Cl.$^4$ ............................................... H04N 3/14
[52] U.S. Cl. ................................. 358/213.11; 357/24; 382/65
[58] Field of Search ...................... 358/213.11, 213.13; 357/24 LR, 30 P, 52

[56] References Cited

U.S. PATENT DOCUMENTS

| 4,527,007 | 7/1985 | Fuse | 357/30 |
| 4,644,406 | 2/1986 | Nishigaki et al. | 358/213.11 |
| 4,665,422 | 3/1987 | Hirao et al. | 357/24 LR |
| 4,737,833 | 2/1986 | Tabei | 358/213.11 |

Primary Examiner—Jin F. Ng
Assistant Examiner—Stephen Brinich
Attorney, Agent, or Firm—Bruce L. Adams; Van C. Wilks

[57] ABSTRACT

A photo-electro conversion sensor of the image sensor is covered with a single layer passivation film or a multi-layer passivation film composed of plural layers having the substantially same refractive indexes, and the thickness of the passivation film is arranged some ten times as much as the wavelength of incident light so as to eliminate interference.

15 Claims, 2 Drawing Sheets

IMAGE SENSOR WITH REDUCED SURFACE REFLECTION INTERFERENCE

BACKGROUND OF THE INVENTION

The present invention relates to an image sensor for use in a facsimile and an image scanner to convert an optical signal into an electric signal.

FIG. 2 is a sectional view of a photo-electro conversion element 8 in a conventional image sensor. A photo-electro conversion region 2 such as pn junction is formed in a semiconductor substrate 1. The photo-electro conversion region 2 is sequentially covered with an oxide layer 3, a nitride layer 5 and a resin layer 6. A portion other than the photo-electro conversion region 2 is covered with a light-shielding layer 4 made of, for example, aluminum so as to block incident light.

However, in the conventional image sensor, the thickness $d_1$ of the oxide layer 3 and the thickness $d_2$ of the nitride layer 5 are comparable to the wavelength of incident light, and the refractive indexes of semiconductor substrate 1, oxide layer 3, nitride layer 5 and resin layer 6 are different so that the reflected light and incident light create multi-interference with each other at the boundary surface between adjacent layers. Due to this multi-interference, transmittance of the incident light depends on the wavelength of incident light. Further, the light transmittance of the same wavelength is varied according to the thicknesses $d_1$ and $d_2$. In the actual semiconductor fabrication process, it is difficult to control the thicknesses $d_1$ and $d_2$ at constant dimensions so that the spectral sensitivity of the image sensor is varied. For this reason, the sensitivity of an individual image sensor is not fixed to a given value when an LED is utilized as a light source.

SUMMARY OF THE INVENTION

It is an object of the present invention to remove such drawbacks of the conventional structure and to eliminate multi-interference in the passivation films to thereby obtain an image sensor having a uniform sensitivity.

In order to solve the above-mentioned drawbacks, according to the present invention, the photo-electro conversion region of the image sensor is covered with a single layer passivation film or multi-layer passivation film composed of plural layers having substantially the same refractive indexes and the thickness of the passivation film is arranged some ten times as much as the wavelength of incident light so as to eliminate the interference.

In the above described structure of image sensor, the refractive index of the passivation film is substantially uniform so that the reflection of incident light is caused only at the boundary between the photo-electro conversion region and the passivation film and at the outer surface of the passivation film. Further, the thickness of the passivation film is some ten times as much as the wavelength of incident light so that interference is not caused between the reflected light and incident light. Consequently, if the light transmittance of the passivation film is sufficiently great, the intensity of light received by the photo-electro conversion region is constant to maintain the sensitivity at a given value without depending on the thickness of single layer or multi-layer passivation film.

DETAILED DESCRIPTION OF THE INVENTION

Figure 1:
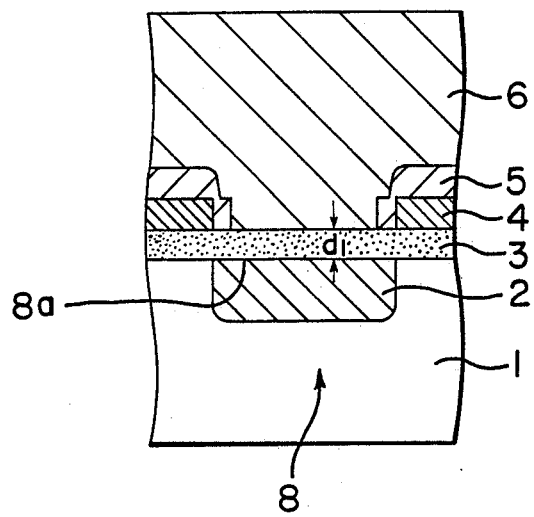
FIG. 1 is a sectional view of a photo-electro conversion element in an image sensor according to the present invention.
Figure 2:
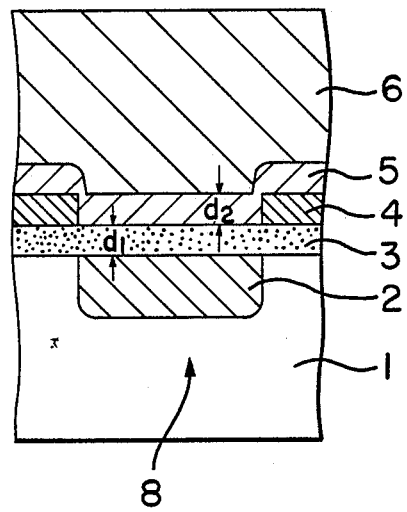
FIG. 2 is a sectional view of a photo-electro conversion element in a conventional image sensor.

Hereinafter, an embodiment of the present invention will be explained in detail in conjunction with the drawings. As shown in FIG. 1, a photo-electro conversion element 8 has a photo-electro conversion region 2 such as a pn junction formed on a semiconductor substrate 1. The upper surface of the photo-electro conversion element 8 defines a light-receiving surface 8a for receiving incident light. An oxide layer 3 including a gate oxide layer and intermediate passivation layer is formed on the semiconductor substrate 1 by a known semiconductor fabrication process. Next, a light-shielding layer 4 of aluminum is formed on the substrate 1 by an electroconductor formation process. As shown in FIG. 1, the light-shielding layer 4 has an opening therethrough in registry with the light-receiving surface 8a for permitting incident light to strike the surface 8a. Then, a nitride layer 5 is formed as a passivation layer over the entire surface of the semiconductor substrate 1. Thereafter, the portion of the nitride layer 5 overlying the photo-electro conversion region 2 is removed by etching to form an opening in the nitride layer 5 in registry with the light-receiving surface 8a. At this time, the light-shielding layer 4 is covered with the nitride layer 5 so as to protect the light shielding layer 4 from thermal stress. This nitride layer 5 is not needed if the reliability of the semiconductor device is ensured. The thus formed semiconductor photo-electro conversion element 8 is mounted on a base plate (not shown) and resin-molded to form a protecting resin layer 6. The resin layer 6 is transparent to transmit the incident light and its refractive index is selected to be substantially identical with that of the oxide layer 3 so as to effectively eliminate formation of multi-interference in the oxide layer 3. The thickness of the resin layer 6 is selected to be some ten times as much as the wavelength of incident light.

In the above described embodiment, the photo-electro conversion region 2 is covered with the optically thick multi-layer passivation film composed of the oxide layer 3 and resin layer 6 to eliminate the interference of the incident light. The multi-layer passivation film has a sufficient light transmittance so that the intensity of light irradiated onto the photo-electro conversion region 2 is maintained constant even if the thickness $d_1$ of oxide layer 3 and the thickness of resin layer 6 are changed.

In the present invention, the image sensor is not limited to the semiconductor device type. Further, a single layer passivation film can be used instead of the multi-layer passivation film. The single layer film should be transparent to the incident light. In the multi-layer film structure, the retractive index of each layer should be substantially equal so as to avoid multi-interference.

Figure 3:
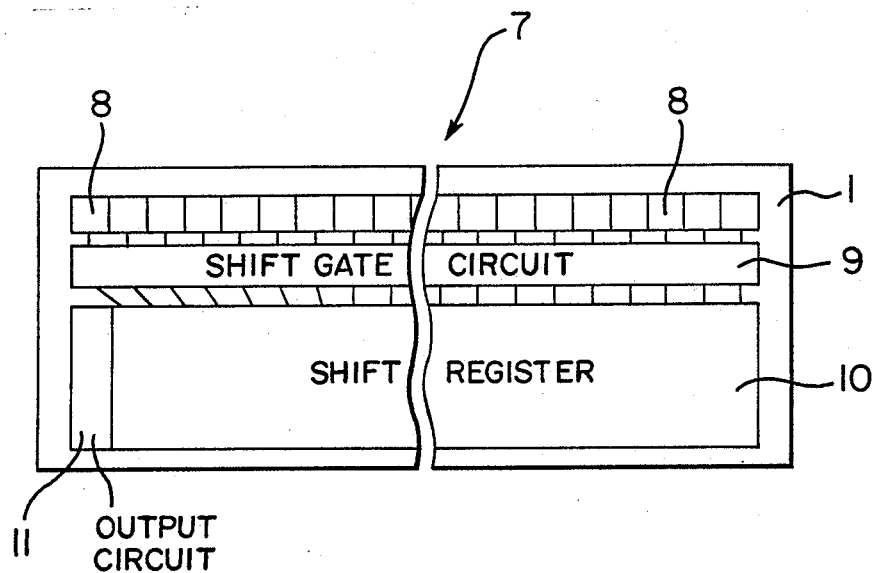
FIG. 3 is a plan view of an image sensor according to the present invention.

FIG. 3 shows a plan view of the image sensor 7 according to the present invention. A plurality of photo-electro conversion elements 8 such as pn junction photo-diodes are linearly arranged on the semiconductor substrate 1. A shift gate circuit 9 and CCD analog shift register 10 are provided adjacent to the conversion elements 8. An output circuit 11 is connected to the shift register 10. The respective photo-diodes 8 produce an electric charge signal in proportion to the amount of incident light received by the photo-diodes 8. The electric charge signal is transferred to the CCD analog shift register 10 through the shift gate circuit 9. The electric charge signal fed to the shift register 10 is sequentially transferred to the output circuit 11, where the electric charge signal is converted into a voltage signal and outputted.

What is claimed is:

1. An image sensor for converting an optical signal into an electric signal, comprising:
   a photo-electro conversion element for effecting photo-electro conversion; and
   a passivation film covering the photo-electro conversion element, the passivation film having a thickness more than ten times the wavelength of incident light to be irradiated onto the photo-electro conversion element, and the passivation film being composed of at least a resin layer.

2. An image sensor according to claim 1; wherein the passivation film is composed of an oxide layer, and a resin layer having a refractive index close to that of the oxide layer.

3. An image sensor according to claim 1; including a nitride layer covering a portion of the image sensor other than the photo-electro conversion element.

4. An image sensor for converting an optical signal into an electric signal, comprising:
   a photo-electro conversion element for effecting photo-electro conversion, the photo-electro conversion element comprising a semiconductor substrate having a photo-electro conversion region formed therein; and
   a passivation film covering the photo-electro conversion element, the passivation film having a thickness more than ten times the wavelength of incident light to be irradiated onto the photo-electro conversion element, the passivation film being composed of a single layer or a plurality of layers having substantially the same refractive indexes.

5. An image sensor according to claim 4; wherein the passivation film is composed of an oxide layer, and a resin layer having a refractive index close to that of the oxide layer.

6. An image sensor according to claim 4; including a nitride layer covering a portion of the image sensor other than the photo-electro conversion element.

7. An image sensor for converting an optical signal to an electrical signal, comprising: photo-electro converting means having a light-receiving surface for converting incident light of a given wavelength to an electrical signal; and a passivation film disposed on the light-receiving surface, the passivation film having a thickness more than ten times greater than the given wavelength of the incident light, and the passivation film being composed of at least a resin layer transparent to incident light of the given wavelength.

8. An image sensor according to claim 7; wherein the passivation film includes an oxide layer disposed on the light-receiving surface beneath the resin layer, the oxide and resin layers having refractive indexes which are the same or substantially the same.

9. An image sensor according to claim 8; further including a light-shielding layer interposed between the resin and oxide layers, the light-shielding layer having an opening therethrough in registry with the light-receiving surface so that the light-shielding layer surrounds but does not cover the light-receiving surface.

10. An image sensor according to claim 9; further including a nitride layer interposed between the resin and light-shielding layers, the nitride layer covering the light-shielding layer but not overlying the light-receiving surface.

11. An image sensor according to claim 7; further including a nitride layer interposed between the resin and oxide layers, the nitride layer having an opening therethrough in registry with the light-receiving surface so that the nitride layer does not overlie the light-receiving surface.

12. An image sensor according to claim 7; wherein the photo-electro converting means comprises a semiconductor photo-electro conversion element.

13. An image sensor according to claim 12; wherein the semiconductor photo-electro conversion element comprises a substrate having a pn junction therein defining a photo-electro conversion region.

14. An image sensor according to claim 12; comprising a plurality of semiconductor photo-electro conversion elements formed on a common substrate, each conversion element having a passivation film disposed on the light-receiving surface thereof.

15. An image sensor according to claim 14; including a common passivation film disposed on the light-receiving surfaces of all the conversion elements.

* * * * *